United States Patent
Bai et al.

(10) Patent No.: US 9,239,407 B2
(45) Date of Patent: Jan. 19, 2016

(54) INJECTION TREATMENT SIMULATION USING CONDENSATION

(71) Applicant: Halliburton Energy Services, Inc., Houston, TX (US)

(72) Inventors: Jie Bai, Houston, TX (US); Avi Lin, Houston, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 199 days.

(21) Appl. No.: 14/139,000

(22) Filed: Dec. 23, 2013

(65) Prior Publication Data

US 2015/0066453 A1    Mar. 5, 2015

Related U.S. Application Data

(60) Provisional application No. 61/870,717, filed on Aug. 27, 2013.

(51) Int. Cl.
| | |
|---|---|
| *G01V 99/00* | (2009.01) |
| *E21B 43/26* | (2006.01) |
| *G06F 17/50* | (2006.01) |

(52) U.S. Cl.
CPC .............. *G01V 99/005* (2013.01); *E21B 43/26* (2013.01); *G01V 2210/646* (2013.01); *G06F 17/5018* (2013.01)

(58) Field of Classification Search
None
See application file for complete search history.

(56) References Cited

U.S. PATENT DOCUMENTS

| | | |
|---|---|---|
| 5,747,750 A | 5/1998 | Bailey et al. |
| 5,992,519 A | 11/1999 | Ramakrishnan et al. |
| 6,182,270 B1 | 1/2001 | Feldmann et al. |
| 6,325,147 B1 | 12/2001 | Doerler et al. |
| 6,389,361 B1 | 5/2002 | Geiser |
| 6,581,685 B2 | 6/2003 | Burgess et al. |
| 6,662,125 B2 | 12/2003 | Namiki |

(Continued)

FOREIGN PATENT DOCUMENTS

| | | |
|---|---|---|
| EP | 1143347 A1 | 10/2001 |
| EP | 1467287 A2 | 10/2004 |
| EP | 2065819 A2 | 6/2009 |

OTHER PUBLICATIONS

Ben., Y., et al. "Simulating Hydraulic Fracturing With Discontinuous Deformation Analysis" American Rock Mechanics Association, ARMA-2012-480 (Jun. 2012) available from <https://www.onepetro.org/conference-paper/ARMA-2012-480>.*

(Continued)

*Primary Examiner* — Aniss Chad
*Assistant Examiner* — Jay B Hann
(74) *Attorney, Agent, or Firm* — Holly Soehnge; Fish & Richardson P.C.

(57) ABSTRACT

An injection treatment on a subterranean zone is simulated by modeling physically separate rock blocks of the subterranean zone by separate block models. The block model for each physically separate rock block represents intra-block mechanics of the rock block by finite element method. Condensation is performed in the finite element method to reduce nodal degrees of freedom operation on by the finite element method. Interactions between adjacent pairs of the rock blocks are modeled by separate joint models. The joint model for each adjacent pair of rock blocks represents inter-block mechanics between the adjacent rock blocks. The injection treatment of the subterranean zone is simulated with the block models and the joint models.

25 Claims, 6 Drawing Sheets

(56) References Cited

U.S. PATENT DOCUMENTS

| | | | |
|---|---|---|---|
| 6,919,964 | B2 | 7/2005 | Chu |
| 6,928,399 | B1 | 8/2005 | Watts et al. |
| 7,068,568 | B2 | 6/2006 | Robertsson |
| 7,478,023 | B2 | 1/2009 | Yu |
| 7,565,278 | B2* | 7/2009 | Li .................. G06F 17/5018 703/10 |
| 7,574,338 | B1 | 8/2009 | Kaul |
| 7,610,183 | B2 | 10/2009 | Danko |
| 8,494,827 | B2* | 7/2013 | Mutlu .................. G01V 9/00 703/10 |
| 2002/0043370 | A1 | 4/2002 | Poe |
| 2003/0050758 | A1 | 3/2003 | Soliman et al. |
| 2003/0062159 | A1 | 4/2003 | Nasr |
| 2004/0204926 | A1 | 10/2004 | Neittaanmaki et al. |
| 2005/0229680 | A1 | 10/2005 | Kfoury et al. |
| 2007/0062273 | A1 | 3/2007 | Kalfayan et al. |
| 2007/0272407 | A1 | 11/2007 | Lehman et al. |
| 2008/0004847 | A1 | 1/2008 | Bradford |
| 2008/0103742 | A1 | 5/2008 | Yu |
| 2008/0133186 | A1 | 6/2008 | Li et al. |
| 2009/0083356 | A1 | 3/2009 | Welkie |
| 2010/0032156 | A1 | 2/2010 | Petty et al. |
| 2010/0057418 | A1 | 3/2010 | Li et al. |
| 2010/0094603 | A1 | 4/2010 | Danko |
| 2010/0224365 | A1 | 9/2010 | Abad |
| 2010/0269578 | A1 | 10/2010 | Detournay et al. |
| 2010/0305914 | A1 | 12/2010 | Zhang et al. |
| 2010/0312529 | A1 | 12/2010 | Souche et al. |
| 2011/0029293 | A1 | 2/2011 | Petty et al. |
| 2011/0120702 | A1 | 5/2011 | Craig |
| 2011/0120705 | A1 | 5/2011 | Walters et al. |
| 2011/0120706 | A1 | 5/2011 | Craig |
| 2011/0120718 | A1 | 5/2011 | Craig |
| 2011/0125471 | A1 | 5/2011 | Craig et al. |
| 2011/0125476 | A1 | 5/2011 | Craig |
| 2011/0213602 | A1 | 9/2011 | Dasari et al. |
| 2012/0203516 | A1 | 8/2012 | Hamann et al. |
| 2013/0332129 | A1* | 12/2013 | Xia .................. G06F 17/5018 703/9 |
| 2015/0153476 | A1* | 6/2015 | Prange .................. G01V 99/005 703/10 |

OTHER PUBLICATIONS

Xu, Yangjian & Yuan, Huang "Applications of Normal Stress Dominated Cohesive Zone Models for Mixed-Mode Crack Simulation Based on Extended Finite Element Methods" Engineering Fracture Mechanics, vol. 78, pp. 544-558 (2011).*

Choi, Dongsoo, et al. "Iterative Method for Dynamic Condensation Combined with Substructuring Scheme" J. Sound & Vibration, vol. 317, pp. 199-218 (2008).*

Jing, L. "A Review of Techniques, Advances and Outstanding Issues in Numerical Modelling for Rock Mechanics and Rock Engineering" Int'l J. Rock Mechanics & Mining Sciences, vol. 40, pp. 283-353 (2003).*

Authorized Officer Jin Ho Kim, PCT International Search Report and Written Opinion of the International Searching Authority, PCT/US2014/053003, Dec. 5, 2014, 12 pages.

Bai et al., "Modeling Subterranean Rock Blocks in an Injection Treatment Simulation", Utility U.S. Appl. No. 13/757,306, filed Feb. 1, 2013, 33 pages.

Yao et al., "Cohesive Fracture Mechanics Based Analysis to Model Ductile Rock Fracture," 44th US Rock Mechanics Symposium and 5$^{th}$ U.S.-Canada Rock Mechanics Symposium, Salt Lake City, UT, Jun. 27-30, 2010, 8 pages.

Bagheri et al., "Modeling of Geomechanics in Naturally Fractured Reservoirs," SPERE&E, Feb. 2008, pp. 108-118.

Warpinski et al., "Stimulating Unconventional Reservoirs: Maximizing Network Growth While Optimizing Fracture Conductivity," paper SPE 114173, prepared for presentation at the SPE Unconventional Reservoirs Conference, Keystone, Colorado, Feb. 10-12, 2008, 19 pages.

Tran et al., "Modelling Discrete Fracture Networks Using Neuro-Fractal—Stochastic Simulation," 2006, Journal of Engineering and Applied Sciences 1 (2), pp. 154-160.

Lin et al., "Two-Scale Modeling of Jointed Rock Masses," International Journal of Rock Mechanics & Mining Sciences 43, 2006, pp. 426-436.

Ku et al., "Modeling of Jointed Rock Masses Using a Combined Equivalent-Continuum and Discrete Approach", International Journal of Rock Mechanics and Mining Sciences, vol. 41, No. 3, 2004, 6 pages.

Couples et al., "Upscaling Fluid-Flow and Geomechanical Properties in Coupled Matrix+Fractures+Fluid Systems," paper SPE 79696 prepared for presentation at the 2003 SPE Reservoir Simulation Symposium, Houston, Texas, Feb. 3-5, 2003, 8 pages.

Jing et al., "Modeling of Fluid Flow and Solid Deformation for Fractured Rocks with Discontinuous Deformation Analysis (DDA) Method," Int. J. Rock Mech. & Mining Science 38, 2001, pp. 343-355.

Ku et al., "Modeling of Jointed Rock Masses Based on the Numerical Manifold Method," PhD Dissertation, University of Pittsburgh, 2001, 241 pages.

Chen et al., "Coupling Fluid-Flow and Geomechanics in Dual-Porosity Modeling of Naturally Fractured Reservoirs—Model Description and Comparison," paper SPE 59043 prepared for presentation at the 2000 SPE International Petroleum Conference and Exhibition in Mexico, Villahermosa, Mexico, Feb. 1-3, 2000, 10 pages.

Osorio et al., "Numerical Simulation of the Impact of Flow-Induced Geomechanical Response on the Productivity of Stress-Sensitive Reservoirs," paper SPE 51929 prepared for presentation at the 1999 SPE Reservoir Simulation Sypmosium, Houston, Texas, Feb. 14-17, 1999, 15 pages.

Jing et al., "Formulation of Discontinuous Deformation Analysis (DDA)—An Implicit Discrete Element Model for Block Systems," Engineering Geology 49, 1998, pp. 371-381.

Chen et al., "Coupling Fluid-Flow and Geomechanics in Dual-Porosity Modeling of Naturally Fractured Reservoirs," paper SPE 38884 prepared for presentation at the 1997 SPE Annual Technical Conference and Exhibition, San Antonio, Texas, Oct. 5-8, 1997, 15 pages.

Shi et al., "Working Forum on Manifold Method of Material Analysis, Volume 2 The Numerical Manifold Method and Simplex Integration," Miscellaneous Paper GL-97-17, US Army Corps of Engineers Waterways Experiment Station, Sep. 1997, 188 pages.

Lin et al., "Extensions of Discontinuous Deformation Analysis for Jointed Rock Masses," Inj. J. Rock Mech. Min. Sci. & Geomech. Abstr., 1996, vol. 33, No. 7, pp. 671-693.

Chen et al., "Coupled Fluid Flow and Geomechanics in Reservoir Study—I. Theory and Governing Equations," paper SPE 30752 prepared for presentation at the 1995 SPE Annual Technical Conference & Exhibition, Dallas, Texas, Oct. 22-25, 1995, 13 pages.

Xu et al., "Numerical Simulations of Fast Crack Growth in Brittle Solids," Division of Engineering, Brown University, Providence, RI, received Dec. 20, 1993; in revised form Mar. 29, 1994, 37 pages.

Priest et al., "Discontinuity Analysis for Rock Engineering," Chapman and Hall, 1993, 490 pages.

Shi et al., "Block System Modeling by Discontinuous Deformation Analysis," Computational Mechanics Publications, Topics in Engineering vol. 11, Boston, Massachusetts, 1993, 224 pages.

Shi et al., "Discontinuous deformation analysis: A new numerical model for the statics and dynamics of block systems," University of California, Berkeley, 1988, 401 pages.

Guyan et al., "Reduction of Stiffness and Mass Matrices," AIAA Journal, vol. 3. No. 2, North American Aviation, Inc., Downey, California, Received Sep. 8, 1964, 1 page.

* cited by examiner

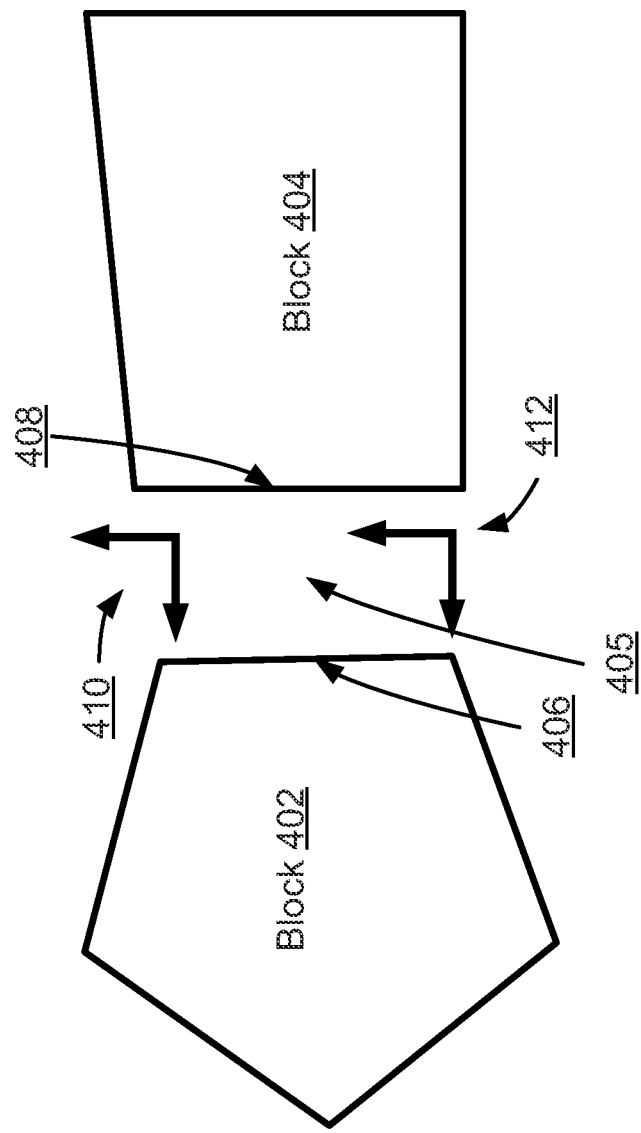

INJECTION TREATMENT SIMULATION USING CONDENSATION

The present application claims benefit under 35 U.S.C. §119 of U.S. Provisional Patent Application No. 61/870,717, entitled "Modeling Subterranean Rock Blocks In An Injection Treatment Simulation" filed Aug. 27, 2013, the entire contents of which are incorporated herein by reference.

BACKGROUND

This specification relates to simulating subterranean rock blocks in an injection treatment simulation. During a fracture treatment, fluids are pumped under high pressure into a rock formation through a well bore to fracture the formation and increase permeability and production from the formation. Applied mathematical models can be used to numerically simulate certain aspects of a fracture treatment. For example, finite element analysis (FEM) can be used to simulate rock deformation, rock stress, and fracture propagation.

DESCRIPTION OF DRAWINGS

FIG. 5 is a schematic diagram of an example joint model.

Like reference symbols in the various drawings indicate like elements.

DETAILED DESCRIPTION

Figure 1A:
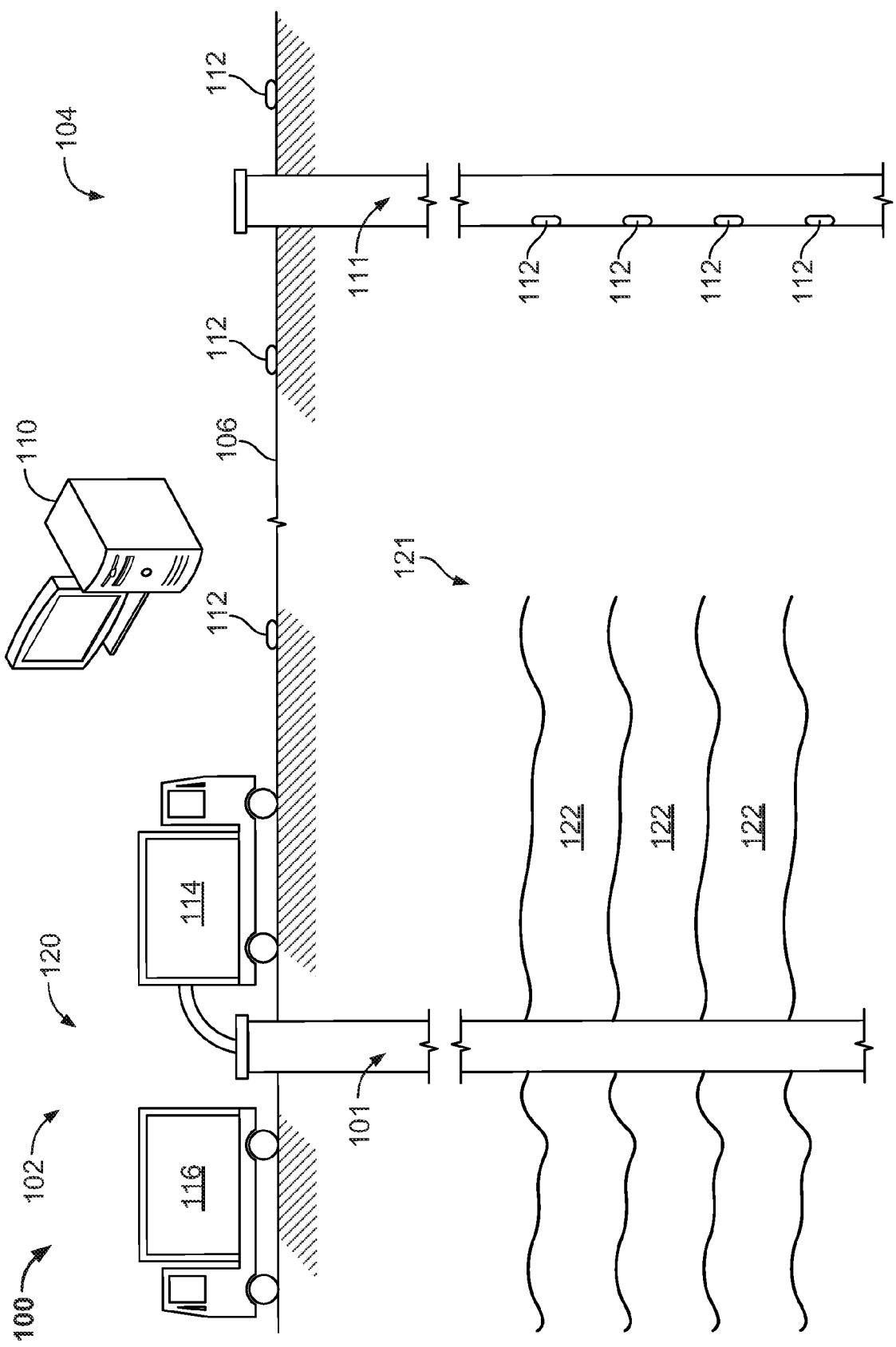
FIG. 1A is a diagram of an example well system.

In some aspects, multiple different types of applied mathematical and computational models are used to numerically simulate an injection treatment system. The applied mathematical models can represent various physical subsystems of an injection treatment system, such as rock blocks, fractures, fracture flows, fluid junction, leak off, wellbores, etc. Appropriate subsystem models can be chosen and combined to model the overall injection treatment system. In some examples, physically separate rock blocks of the subterranean zone are modeled by separate block models, and the interactions between adjacent rock blocks are modeled by separate joint models. The block model for a given rock block represent the rock block's intra-block mechanics, and the joint model for a given pair of rock blocks represents the pair's inter-block mechanics. In some cases, the block models and the joint models are different types of applied mathematical models. For example, the block models can have different governing equations than the joint models, they have different parameters and variables than the joint models, they can model different types of physical phenomena than the joint models, etc.

In some instances, one or more of the adjacent pairs of rock blocks contact each other at multiple physical contact locations. Rather than using the physical contact locations, the joint models can use predefined joint model locations to model the mechanical interactions between the rock blocks. The physical contact locations can be different from the predefined joint locations. In this manner, the joint model for each adjacent pair of rock blocks can represent all inter-block forces between the rock blocks as equivalent forces acting at the predefined joint model locations. In some examples, the Cohesive Zone Models (CZM) can be chosen as the joint model to simulate fracture behavior as well as interaction between the discrete rock blocks.

In some implementations, the block models represents the intra-block mechanics by modeling a solid, physical rock block as a group of discrete block elements. This discrete characterization of the rock blocks, at least in some instances, provides an appropriate representation of the hydraulic fractures and their interaction with natural fractures. For example, a discrete block model can simulate fractured formation, for example, as an opening formed by the movement of discrete rock block elements. In some examples, a finite element method (FEM) model can be chosen as the block model, used to perform deformation and stress analysis for discrete rock blocks.

The block models and joint models can be combined, and in some instances they may be combined with other subsystem models, and used to simulate a hydraulic fracturing process, which can include fracture initiation and propagation in a complex facture network. The FEM model and CZM can be linked, for example, at the nodal contacts defined by the CZM model for each adjacent pair of rock blocks. The simulation system can be developed using additional or different types of models and components, or the models can be configured in another manner.

In some implementations, additional or different subsystems models can be used in a simulation system to build a comprehensive software package that simulates and analyzes injection treatments. For example, fracturing fluid simulation models, wellbore models, and other types of models can be combined with the block models and joint models, for instance, to simulate hydraulic fracturing of a subterranean zone.

Notably, although described herein in the context of simulating an injection treatment on a subterranean zone, and the resulting stresses, strains, and related fractures flow and pressure analysis for solids in the fracture network, the concepts described herein are applicable to many other systems and structural dynamics domains.

FIG. 1A shows a schematic diagram of an example well system 100 with a computing subsystem 110. The example well system 100 includes a treatment well 102 and an observation well 104. The observation well 104 can be located remotely from the treatment well 102, near the treatment well 102, or at any suitable location. The well system 100 can include one or more additional treatment wells, observation wells, or other types of wells. The computing subsystem 110 can include one or more computing devices or systems located at the treatment well 102, at the observation well 104, or in other locations. The computing subsystem 110 or any of its components can be located apart from the other components shown in FIG. 1A. For example, the computing subsystem 110 can be located at a data processing center, a computing facility, or another suitable location. The well system 100 can include additional or different features, and the features of the well system can be arranged as shown in FIG. 1A or in any other suitable configuration.

The example treatment well 102 includes a well bore 101 in a subterranean zone 121 beneath the surface 106. The subterranean zone 121 can include one or less than one rock formation, or the subterranean zone 121 can include more than one rock formation. In the example shown in FIG. 1A, the subterranean zone 121 includes various subsurface layers 122. The subsurface layers 122 can be defined by geological or other properties of the subterranean zone 121. For example, each of the subsurface layers 122 can correspond to a particular lithology, a particular fluid content, a particular stress or pressure profile, or any other suitable characteristic. In some instances, one or more of the subsurface layers 122 can be a fluid reservoir that contains hydrocarbons or other types of fluids.

The subterranean zone 121 may include any suitable rock formation. For example, one or more of the subsurface layers 122 can include sandstone, carbonate materials, shale, coal, mudstone, granite, or other materials. In some instances, the subterranean zone 121 includes a fracture network in a fractured rock formation. Fracture networks can include natural fractures, induced fractures, or both. A fracture network can define multiple rock blocks in the rock formation, and the rock blocks can range in size from centimeters, or smaller, in size to hundreds of meters, or larger.

The example treatment well 102 includes an injection treatment subsystem 120, which includes instrument trucks 116, pump trucks 114, and other equipment. The injection treatment subsystem 120 can apply an injection treatment to the subterranean zone 121 through the well bore 101. The injection treatment can be a fracture treatment that fractures the subterranean zone 121. For example, the injection treatment may initiate, propagate, or open fractures in one or more of the subsurface layers 122. A fracture treatment may include a mini fracture test treatment, a regular or full fracture treatment, a follow-on fracture treatment, a re-fracture treatment, a final fracture treatment or another type of fracture treatment.

The fracture treatment can inject a treatment fluid into the subterranean zone 121 at any suitable fluid pressures and fluid flow rates. Fluids can be injected above, at or below a fracture initiation pressure, above at or below a fracture closure pressure, or at any suitable combination of these and other fluid pressures. The fracture initiation pressure for a formation is the minimum fluid injection pressure that can initiate or propagate artificial fractures in the formation. Application of a fracture treatment may or may not initiate or propagate artificial fractures in the formation. The fracture closure pressure for a formation is the minimum fluid injection pressure that can dilate existing fractures in the subterranean formation. Application of a fracture treatment may or may not dilate natural or artificial fractures in the formation.

A fracture treatment can be applied by any appropriate system, using any suitable technique. The pump trucks 114 may include mobile vehicles, immobile installations, skids, hoses, tubes, fluid tanks or reservoirs, pumps, valves, or other suitable structures and equipment. In some cases, the pump trucks 114 are coupled to a working string disposed in the well bore 101. During operation, the pump trucks 114 can pump fluid through the working string and into the subterranean zone 121. The pumped fluid can include a pad, proppants, a flush fluid, additives, or other materials.

A fracture treatment can be applied at a single fluid injection location or at multiple fluid injection locations in a subterranean zone, and the fluid may be injected over a single time period or over multiple different time periods. In some instances, a fracture treatment can use multiple different fluid injection locations in a single well bore, multiple fluid injection locations in multiple different well bores, or any suitable combination. Moreover, the fracture treatment can inject fluid through any suitable type of well bore, such as, for example, vertical well bores, slant well bores, horizontal well bores, curved well bores, or any suitable combination of these and others.

A fracture treatment can be controlled by any appropriate system, using any suitable technique. The instrument trucks 116 can include mobile vehicles, immobile installations, or other suitable structures. The instrument trucks 116 can include an injection control system that monitors and controls the fracture treatment applied by the injection treatment subsystem 120. In some implementations, the injection control system can communicate with other equipment to monitor and control the injection treatment. For example, the instrument trucks 116 may communicate with the pump truck 114, subsurface instruments, and monitoring equipment.

The observation well 104 shown in FIG. 1A includes a well bore 111 in a subterranean region beneath the surface 106. The observation well 104 includes sensors 112 and other equipment that can be used to detect microseismic information. The sensors 112 may include geophones or other types of listening equipment. The sensors 112 can be located at a variety of positions in the well system 100. In FIG. 1A, sensors 112 are installed at the surface 106 and beneath the surface 106 in the well bore 111. Additionally or alternatively, sensors may be positioned in other locations above or below the surface 106, in other locations within the well bore 111, or within another well bore. The observation well 104 may include additional equipment (e.g., working string, packers, casing, or other equipment) not shown in FIG. 1A. In some implementations, microseismic data are detected by sensors installed in the treatment well 102 or at the surface 106, without use of an observation well.

In some cases, all or part of the computing subsystem 110 can be contained in a technical command center at the well site, in a real-time operations center at a remote location, in another appropriate location, or any suitable combination of these. The well system 100 and the computing subsystem 110 can include or access any suitable communication infrastructure. For example, well system 100 can include multiple separate communication links or a network of interconnected communication links. The communication links can include wired or wireless communications systems. For example, sensors 112 may communicate with the instrument trucks 116 or the computing subsystem 110 through wired or wireless links or networks, or the instrument trucks 116 may communicate with the computing subsystem 110 through wired or wireless links or networks. The communication links can include a public data network, a private data network, satellite links, dedicated communication channels, telecommunication links, or any suitable combination of these and other communication links.

The computing subsystem 110 can simulate application of the fracture treatments to the subterranean formation through one or more well bores. For example, the computing subsystem 110 can simulate and predict fracture initialization and propagation during fracture treatments applied through the well bores 101. The simulation may rely on a fracture simulation system that can reflect the physical process of fracture treatments. The computing subsystem 110 can design or modify fracture treatments based on the simulations. For example, the computing subsystem 110 may calculate, select, or optimize fracture treatment parameters for initialization, propagation, or opening fractures in one or more of the subsurface layers 122.

Some of the techniques and operations described herein may be implemented by a computing subsystem configured to provide the functionality described. In various embodiments, a computing device may include any of various types of devices, including, but not limited to, personal computer systems, desktop computers, laptops, notebooks, mainframe computer systems, handheld computers, workstations, tablets, application servers, storage devices, or any type of computing or electronic device.

Figure 1B:
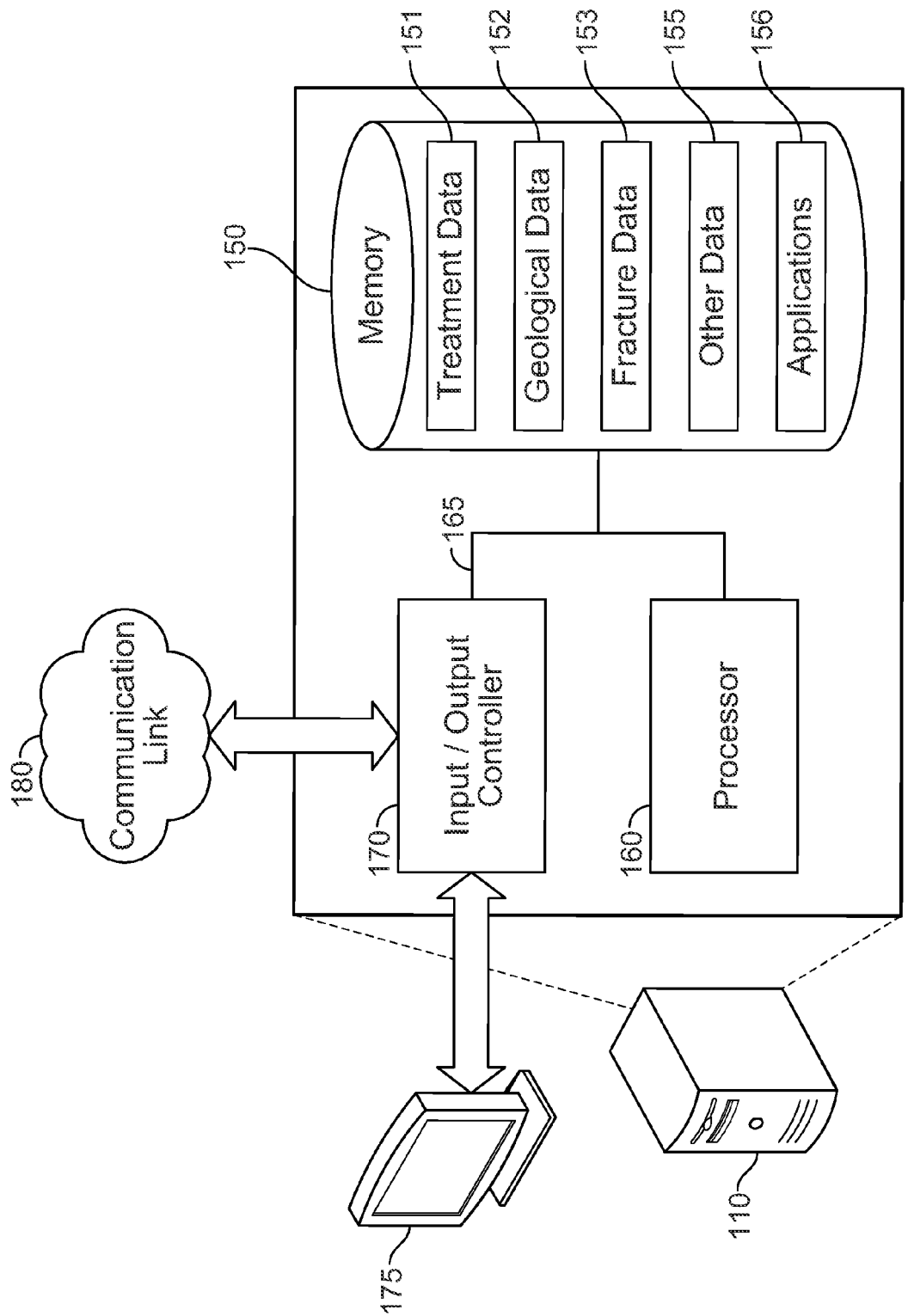
FIG. 1B is a diagram of the example computing subsystem in FIG. 1A.

FIG. 1B is a diagram of the example computing subsystem 110 of FIG. 1A. The example computing subsystem 110 can be located at or near one or more wells of the well system 100 or at a remote location. All or part of the computing subsystem 110 may operate independent of the well system 100 or independent of any of the other components shown in FIG. 1A. The example computing subsystem 110 includes a processor 160, a memory 150, and input/output controllers 170 communicably coupled by a bus 165. The memory can include, for example, a random access memory (RAM), a storage device (e.g., a writable read-only memory (ROM) or others), a hard disk, or another type of storage medium. The computing subsystem 110 can be preprogrammed or it can be programmed (and reprogrammed) by loading a program from another source (e.g., from a CD-ROM, from another computer device through a data network, or in another manner). The input/output controller 170 is coupled to input/output devices (e.g., a monitor 175, a mouse, a keyboard, or other input/output devices) and to a communication link 180. The input/output devices receive and transmit data in analog or digital form over communication links such as a serial link, a wireless link (e.g., infrared, radio frequency, or others), a parallel link, or another type of link.

The communication link 180 can include any type of communication channel, connector, data communication network, or other link. For example, the communication link 180 can include a wireless or a wired network, a Local Area Network (LAN), a Wide Area Network (WAN), a private network, a public network (such as the Internet), a WiFi network, a network that includes a satellite link, or another type of data communication network.

The memory 150 can store instructions (e.g., computer code) associated with an operating system, computer applications, and other resources. The memory 150 can also store application data and data objects that can be interpreted by one or more applications or virtual machines running on the computing subsystem 110. As shown in FIG. 1B, the example memory 150 includes treatment data 151, geological data 152, fracture data 153, other data 155, and applications 156. In some implementations, a memory of a computing device includes additional or different information.

The treatment data 151 can include information on fracture treatment plans. For example the treatment data 151 can indicate a pumping schedule, parameters of a previous injection treatment, parameters of a future injection treatment, and/or parameters of a proposed injection treatment. Such parameters may include information on flow rates, flow volumes, slurry concentrations, fluid compositions, injection locations, injection times, or other parameters. The treatment data 151 can include treatment parameters that have been optimized or selected based on numerical simulations of complex fracture propagation.

The geological data 152 can include information on the geological properties of the subterranean zone 121. For example, the geological data 152 may include information on the subsurface layers 122, information on the well bores 101, 111, or information on other attributes of the subterranean zone 121. In some cases, the geological data 152 includes information on the lithology, fluid content, stress profile, pressure profile, spatial extent, or other attributes of one or more rock formations in the subterranean zone. The geological data 152 can include information collected from well logs, rock samples, outcroppings, microseismic imaging, or other data sources.

The fracture data 153 can include information on fracture planes in a subterranean zone. The fracture data 153 may identify the locations, sizes, shapes, and other properties of fractures in a model of a subterranean zone. The fracture data 153 can include information on natural fractures, hydraulically-induced fractures, or any other type of discontinuity in the subterranean zone 121. The fracture data 153 can include fracture planes calculated from microseismic data or other information. For each fracture plane, the fracture data 153 can include information (e.g., strike angle, dip angle, etc.) identifying an orientation of the fracture, information identifying a shape (e.g., curvature, aperture, etc.) of the fracture, information identifying boundaries of the fracture, or any other suitable information. The fracture data 153 can include information on rock blocks and rock block intersections. For each rock block, the fracture data 153 can include information identifying a location and orientation of the rock block, a shape and boundaries of the rock block, the stress, strain, and other mechanical properties of the rock block, permeability, transmissibility, or other material properties of the rock block, thermodynamic properties of the rock block, contact locations or joint locations with other rock blocks, or a combination of these and any other suitable information.

The applications 156 can include software applications, scripts, programs, functions, executables, or other modules that are interpreted or executed by the processor 160. Such applications may include machine-readable instructions for performing one or more of the operations associated with an injection treatment simulation system as described below. The applications 156 may include machine-readable instructions for generating a user interface. The applications 156 can obtain input data, such as treatment data, geological data, or other types of input data, from the memory 150, from another local source, or from one or more remote sources (e.g., via the communication link 180). The applications 156 can generate output data and store the output data in the memory 150, in another local medium, or in one or more remote devices (e.g., by sending the output data via the communication link 180).

Figure 3:
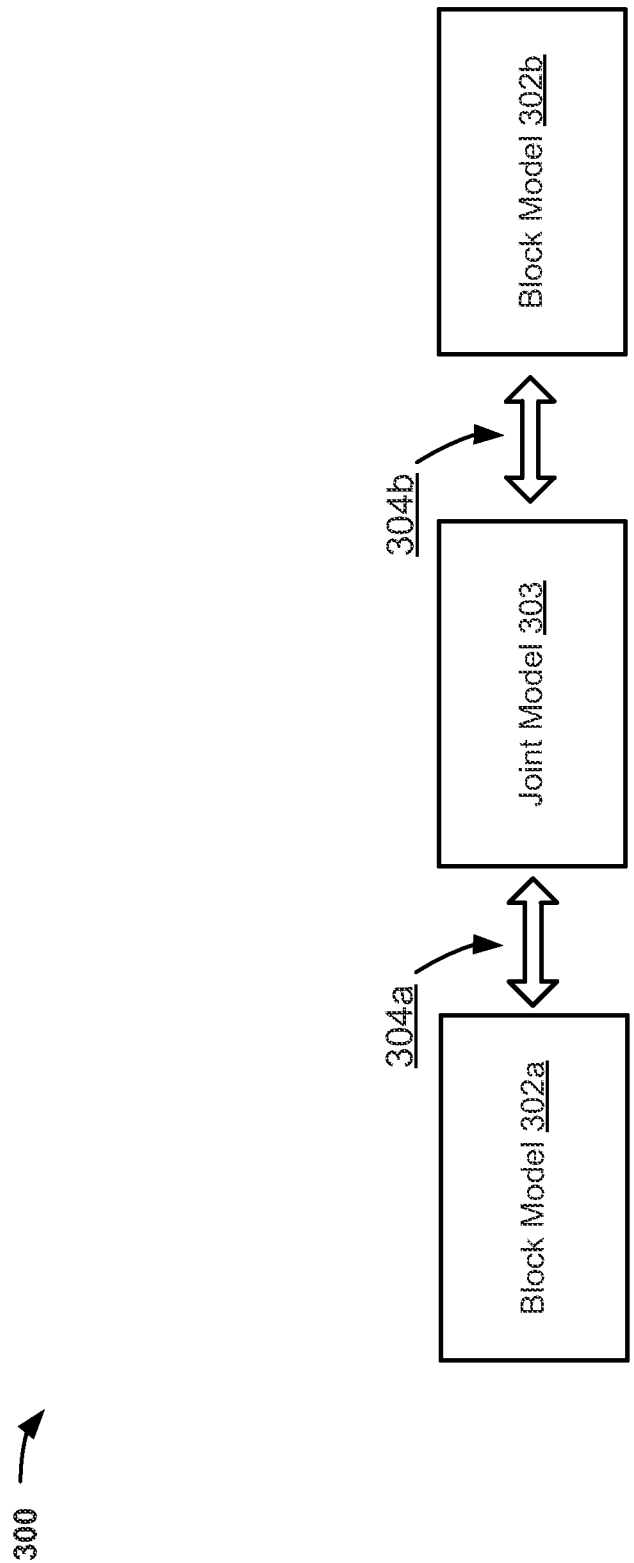
FIG. 3 is a schematic diagram of an example fracture simulation architecture.

The processor 160 can execute instructions, for example, to generate output data based on data inputs. For example, the processor 160 can run the applications 156 by executing or interpreting the software, scripts, programs, functions, executables, or other modules contained in the applications 156. The processor 160 may perform one or more of the operations associated with the simulation system as illustrated in FIG. 3. The input data received by the processor 160 or the output data generated by the processor 160 can include any of the treatment data 151, the geological data 152, the fracture data 153, or the other data 155.

Figure 2:
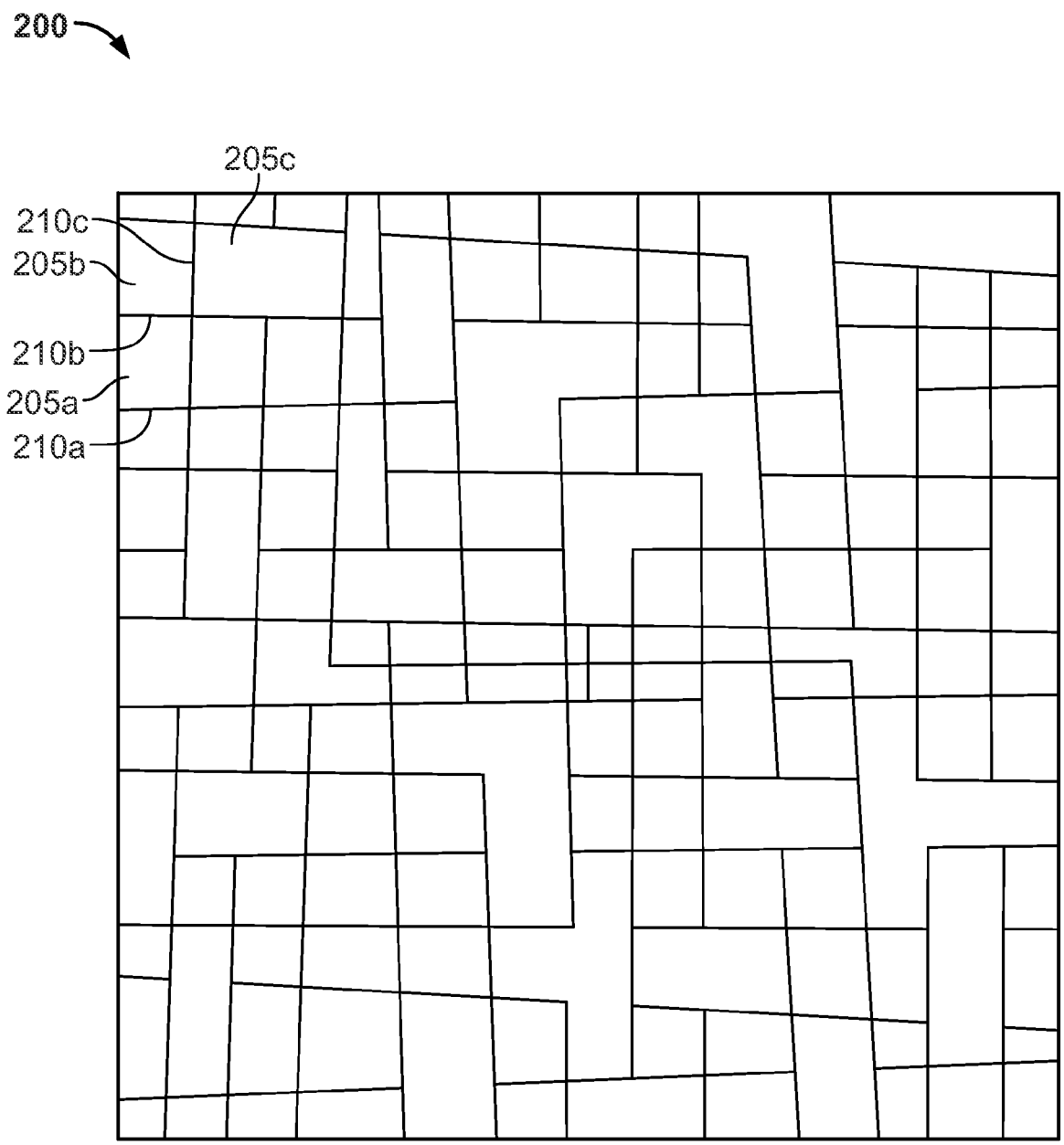
FIG. 2 is a schematic diagram of an example rock mass.

FIG. 2 is a schematic diagram of an example rock mass 200. Fracture treatments and other activities can cause complex fracture patterns to develop within the natural fracture pattern in the formation. For example, hydraulic fracturing may include pumping fracturing fluid into a subterranean formation through a wellbore under a pressure exceeding the formation stress so that the formation can be artificially fractured. The hydraulic fractures and their interaction with natural fractures can, in some instances, form discrete rock blocks in the formation. As illustrated in FIG. 2, the example rock mass 200 includes a number of discrete rock blocks such as, for example, 205a, 205b and 205c, etc. The discrete rock blocks 205a, 205b and 205c can have different sizes and shapes. The example rock mass 200 includes a number of fractures such as 210a, 210b, and 210c, etc. In the example shown, the fractures define at least a portion of the rock block geometries. The fractures 210a, 210b, and 210c between the rock blocks can have different orientations and can be initially open, or closed. The fractures can form complex fracture networks. The fractures can provide flow channels for fracturing fluid for fracturing treatment.

A simulation system can define data structures to model the behavior of the rock blocks and the fractures during an injection treatment. For example, the simulation system may include block models for deformation analysis of discrete rock block, joint models for simulating fracture behavior as well as interactions between discrete rock blocks, or any other suitable models. In some instances, simulating an injection treatment can include simulating fracture initiation and propagation in a fracture network such as, for example, the example fracture network shown in FIG. 2. In some instances, numerical models are operated to simulate fluid flow in and about the example rock blocks 205a, 205b, 205c, etc., time-evolution of the example rock blocks 205a, 205b, 205c, etc., interactions between the example rock blocks 205a, 205b, 205c, etc., time evolution of the example fractures 210a, 210b, 210c, etc., fluid flow in the example fractures 210a, 210b, 210c, etc., and other behavior during an injection treatment.

FIG. 3 is a schematic diagram of an example fracture simulation architecture 300. The example fracture simulation architecture 300 includes two block models 302a and 302b, and a joint model 303. The example block models 302a and 302b each represent a discrete rock block. For example, the block model 302a can represent one of the example rock blocks 205a, 205b, or 205c shown in FIG. 2, and the other block model 302b can represent a different, adjacent one of the example rock blocks 205a, 205b, or 205c. The block models 302a and 302b can be the same type of block model, or they can be different types of block models.

Each of the example block models 302a and 302b can represent mechanical properties of an individual rock block, which may include static mechanical properties (e.g., position, stress, strain, Young's Modulus, Poisson's Ratio), dynamic mechanical properties (e.g., deformation, movement, rotation, etc.), or a combination of these and other types of mechanics. In some instances, the block models are operable to perform a deformation analysis or other types of analysis of the discrete rock block.

The joint model 303 can represent an interaction of two adjacent rock blocks. In the example shown in FIG. 2, the joint model 303 can represent the fracture between the adjacent rock blocks 205a and 205b, between the adjacent rock blocks 205b and 205c, etc. In some cases, the rock blocks 205a and 205c may also be considered adjacent, and a joint model can represent their interaction. In some cases, the joint model 303 is a different type of numerical model from the block models 302a, 302b. The joint model 303 can represent mechanical properties of a fracture between two adjacent rock blocks, which may include static mechanical properties (e.g., aperture, length, etc.), dynamic mechanical properties (e.g., dilation, contraction, etc.), or a combination of these and other types of mechanics.

The joint model 303 can be coupled with the block models 302a and 302b, for example, via links 304a and 304b, respectively. A joint model can be used, in some instances, to simulate fracture behavior as well as interactions between rock blocks. As an example, the joint model 303 can simulate the behavior of the fracture 210b and interactions between the two adjacent rock blocks 205a and 205b. In some instances, a block model may take force as an input parameter and return the location, orientation, stresses and strains of the block as output variables. In some instances, a joint model can take the input parameters, for example, positions of the adjacent rock blocks, distances between the two blocks, and return, for example, forces towards each of the two blocks as output. There may be a joint model for each pair of adjacent rock blocks (e.g., pairs of blocks that contact each other, pairs of blocks without substantial structure separating them, etc.).

In some instances, the example simulation architecture 300 can include additional or different models, such as a fluid junction model, a fracture flow model, a leak off model, a wellbore model, etc. In some implementations, the example fracture simulation architecture 300 can include additional block models and joint models to represent all rock blocks and joints, or a portion of the rock blocks and joints, in a complex fracture network. The example fracture simulation architecture 300 can be configured to simulate an injection treatment on a computing system. For example, one or more of the applications 156 on the computing subsystem 110 shown in FIG. 1B can be implemented based on the example simulation architecture 300 shown in FIG. 3. In some cases, the example simulation architecture 300 can be used to implement numerical simulations based on the example predefined joint model locations between rock blocks shown in FIG. 4, or the simulation architecture 300 can be used in another manner. Generally, a simulation system can include additional or different modules or components with suitable functionality, and the features of a simulation system can function as represented with respect to the example shown in FIG. 3 or in another manner. In some cases, fracture initiation and propagation are modeled by time-evolution of the joint models; and normal and shear failure of the rock blocks can be modeled by time-evolution of the block models. Additional or different aspects of a subterranean zone may be modeled.

In certain instances, the block models (e.g., 302a and 302b) can perform deformation and stresses analysis using the finite element method (FEM). For example, FEM may treat the rock media as continuum, while other models may treat the rock media as discrete particles. The flexible spatial discretization used in FEM makes it suitable for complex shapes of rock blocks. The finer the meshes used the FEM, the more detailed and accurate stressed and deformation information FEM can produce.

Various techniques can be used by the joint models (e.g., 303) to simulate fracture behavior as well as interactions between discrete rock blocks. In some implementations, the Mohr-Coulomb shear failure criterion and tensile strength criteria can be used to describe the failure between rock blocks. In some implementations, Cohesive Zone Models (CZM) can be used to describe fracture behavior. For example, CZM can be used in numerical simulations of dynamic crack growth in brittle (or quasi-brittle) solids. In some computational simulations, the cohesive law is used to model the behavior of a weak interface in the solids. CZM can treat fracture as a gradual process in which separation of fractures is resisted by cohesive traction forces. Compared with the traditional empirical methods, CZM can predict entire fracture process from crack initiation to propagation accurately for any joint geometry and any applied load. In some implementations, CZM also can correlate the effects between shear and normal failure.

In some implementations, physically separate rock blocks of a subterranean zone can be modeled by separate block models. For example, the discrete rock blocks 205a and 205b of the example rock mass 200 may be modeled by the example block models 302a and 302b, respectively. The block model for each physically separate rock block can represent intra-block mechanics of the rock block. Each block model can represent an intra-block mechanics of a rock block as a group of discrete block elements. For example, the block models 302a and 302b can be the FEM models. In some implementations, the block model for each rock block can represent intra-block mechanics of the rock block in response to inter-block forces determined by the joint models. For example, the block models 302a and 302b may represent intra-block mechanics of the discrete rock blocks 205a and 205b in response to inter-block forces derived by the joint model 303.

In some implementations, interactions between adjacent pairs of the rock blocks are modeled by separate joint models. The joint model for each adjacent pair of rock blocks can represent inter-block mechanics between the adjacent rock blocks. In some instances, the joint model for each adjacent pair of rock blocks can represent inter-block mechanics between the adjacent rock blocks as predefined inter-block joints. The inter-block mechanics can include, for example, fracture behavior such as fracture initiation and propagation. In the example shown in FIG. 3, the example joint model 303 may be used to model the behavior of the fracture 210b and the inter-block mechanics between the two adjacent rock blocks 205a and 205b, or the example joint model 303 may be used to model the behavior of the fracture 210c and the inter-block mechanics between the two respective adjacent rock blocks 205b and 205c. As an example, the joint model 303 can be CZM or another type of joint model. In some implementations, the joint model for each adjacent pair of rock blocks can represent inter-block mechanics between adjacent rock blocks in response to rock block movement derived by the block models. For example, the joint model 303 may represent the inter-block mechanics between the two adjacent rock blocks 205a and 205b in response to the movements of the rock blocks 205a and 205b, or the inter-block mechanics between the two adjacent rock blocks 205b and 205c in response to the movements of the rock blocks 205b and 205c.

In some implementations, one or more of the adjacent pairs of rock blocks contact each other at physical contact locations. For example, the adjacent rock blocks (e.g., 205a and 205b, etc.) may physically contact each other at multiple locations. The joint model for each adjacent pair of rock blocks can represent inter-block forces between the rock blocks at predefined joint model locations that are different from the physical contact locations. In other words, instead of using the actual physical contact locations, a few predefined joint model locations can be set and regarded as reference contact locations that can be used for calculating the inter-block forces, for instances. Based on the predefined joint model locations, the joint model for each adjacent pair of rock blocks can represent all inter-block forces between the rock blocks as equivalent forces acting at the predefined joint model locations.

Figure 4:
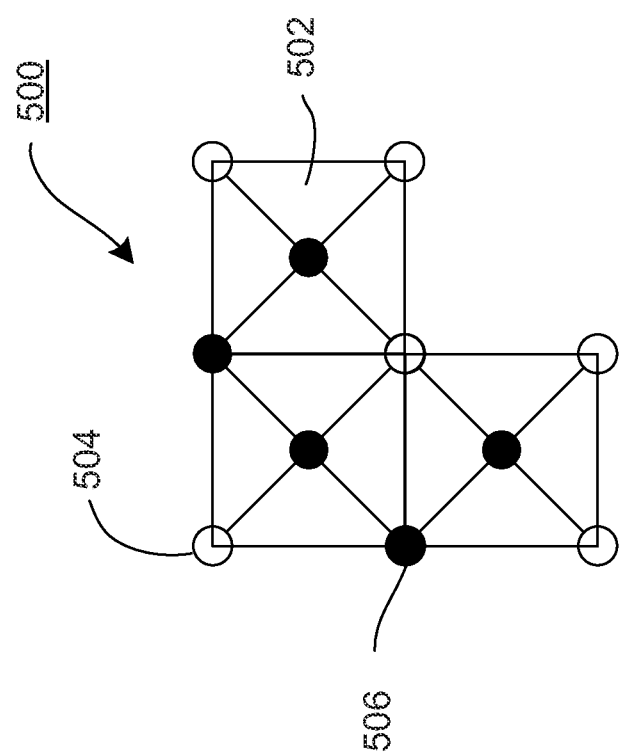
FIG. 4 is a schematic of a finite element mesh of a concave rock block.

FIG. 4 is a schematic diagram of an example joint model 400. In the example shown in FIG. 4, the two blocks 402 and 404 are adjacent to each other. The surfaces 406 and 408 of the two adjacent rock blocks 402 and 404 define at least part of a fracture. As such, the surfaces 406 and 408 may be considered fracture surfaces. The two rock blocks 402 and 404 may physically contact each other at one or more points along the surfaces 406 and 408, or there may be no physical contact between the two rock blocks 402 and 404. A joint model can be used to represent the interactions between the two adjacent rock blocks 402 and 404. In some implementations, instead of modeling each and every physical contact location of the two rock blocks 402 and 404, the example joint model 400 may use a small number (e.g., one, two, three, four, etc.) of predefined joint model locations to simplify the contacts between the two rock blocks 402 and 404. For instance, the example joint model 400 shown in FIG. 4 includes predefined joint model locations at two nodal contacts 410 and 412. The example nodal contacts 410 and 412 are the contacts between two corner nodes of adjacent discrete blocks. The predefined joint model locations can include additional or different locations, or they can be configured in another manner.

In some instances, using predefined joint model locations can provide advantages, for example, in a numerical simulation of an injection treatment. For example, rather than searching and calculating the forces applied at each physical contact location between each adjacent pair of rock blocks, the equivalent forces can be calculated only at the predefined joint model locations. In some implementations, the joint model can calculate the equivalent forces acting at the predefined joint model locations, which can represent all inter-block forces between the rock blocks. Computational complexity can be reduced, for example, because the contact locations of the joint models are known, which can avoid the computationally expensive contact tracking process. In some instances, with the predefined joint model locations, a simulation system can better represent an actual physical system. For example, in some instances, an underground complex fracture network can be confined by a high pressure environment, and the deformation of the complex fracture network during the hydraulic fracturing process may be relatively small. The block models with equivalent forces acting at the simplified contact locations (e.g., 406 and 408) may demonstrate less rock movement and enhanced robustness, for example, due to reduced sensitivity to forces at every physical contact location as well as the potentially complicated interactions between each pair of discrete block elements. In some instances, the block models with reduced motion may better reflect the actual underground complex fracture network, for example, where only limited deformations occur due to high pressure imposed by the environment, and in other environments.

In some examples, a FEM-type model can be used to define the block models (e.g., 302a and 302b) for the deformation analysis and for the stresses analysis and any combination thereof of discrete one continuous rock block. And, for example, the CZM can be chosen as the joint model (e.g., 303) to describe fracture behavior as well as interactions between discrete rock blocks. The FEM model and CZM can be coupled together, for example, via a local nodal contacts of discrete rock blocks. The predefined joint model locations can be simplified, for example, to two nodal contacts (e.g., 410 and 412 as illustrated in FIG. 4) or any other number of locations. CZM can then, for example, be used on these nodal contacts for fracture behavior simulation.

Generally, in FEM, finer meshes (i.e., some of the elements will be smaller) produce results closer to the real solution than coarser meshes. The computational cost, however, increases as the mesh becomes finer, because the total number of elements and degrees of freedom increase. For a very large fracture network, the computational simulation might not be feasible because of the limitation of computational power. In certain instances, the concepts herein propose employing condensation to reduce the total number of degrees of freedom while maintaining the accuracy of original system. In one example, a condensation technique called Guyan condensation, the total degrees of freedom are divided into two parts. One part is called master degrees of freedom, and the other part is called slave degrees of freedom. A condensation matrix is used to define the linear relationship between slave and master degrees of freedom, while calculating the reduced stiffness and mass matrices. After condensation, computation is performed only on master degrees of freedom. It is only portion of original system, so the original system is reformatted to a reduced system with fewer degrees of freedom and thus the computation cost is also reduced. Although Guyan condensation is discussed herein, other condensation techniques can be used. Other condensation techniques that can be used include dynamic condensation, improved reduced system, hybrid condensation and/or others.

In certain instances, the condensation can be performed by parallel computing algorithms and technologies, where the condensation can be performed on two or more of the rock blocks concurrently using parallel threads. The reduced stiffness and mass matrices can be used for similar blocks to further reduce computation costs. If greater accuracy is desired, more master degrees of freedom can be used. The modeling can be implemented concurrently, and in real time, with the flows that are being modeled (i.e. concurrently with the fracturing operation). The displacements and other mechanical information on slave degrees of freedom can be calculated in post-processing for more accurate results.

In a FEM model, including displacements and strains distribution can be defined as unknowns on each discrete block, and solved using governing equations to represent the rock dynamics. An example governing equation based on the FEM model can be formulated as a time-dependent discrete equations system, such as illustrated in Equation (1), $$M\ddot{x} + C\dot{x} + Kx = F \quad (1),$$

where M, C and K are the mass matrix, the damping matrix and the stiffness matrix respectively, and F represents the forces vector applied to the rock block. In the example approach where the FEM and CZM are coupled via nodal contacts, the forces vector F can be the forces applied at the block nodal points. The variable x in Equation (1) is the vector of unknowns, which contains, for example, displacements at the corners of the rock block and strain components of the rock block. The variable $$\dot{x} = \frac{dx}{dt}$$

is the time derivative of the vector x, and $$\ddot{x} = \frac{d\dot{x}}{dt}$$

is the time derivative of the vector $\dot{x}$, or equivalently the second time derivative of the vector x. As a specific example, each entry of the vector x can include two displacement components on each corner of the block. The displacements can include, for example, an x-coordinate and a y-coordinate in an xy-coordinate system (which can indicate a location or movement of the corners of the rock block).

Applying the condensation to Eq. (1), x is divided into master degrees of freedom (index m), which will be retained in the reduced model, and slave degrees of freedom (index s), where the index s variables will be eliminated from the full model. Equation (1) can be rewritten in a partitioned form as follows:

$$\begin{bmatrix} M_{mm} & M_{ms} \\ M_{sm} & M_{ss} \end{bmatrix} \begin{Bmatrix} \ddot{x}_m \\ \ddot{x}_s \end{Bmatrix} + \begin{bmatrix} C_{mm} & C_{ms} \\ C_{sm} & C_{ss} \end{bmatrix} \begin{Bmatrix} \dot{x}_m \\ \dot{x}_s \end{Bmatrix} + \begin{bmatrix} K_{mm} & K_{ms} \\ K_{sm} & K_{ss} \end{bmatrix} \begin{Bmatrix} x_m \\ x_s \end{Bmatrix} = \begin{Bmatrix} F_m \\ F_s \end{Bmatrix} \quad (2)$$

The relationship of displacements between master and slave degrees of freedom can be defined using dynamic condensation matrix R as follows:

$$x_s = R x_m \quad (3)$$

Substituting Equation (3) into Equation (1), the reduced dynamic system is defined as:

$$M_R = M_{mm} + R^T M_{sm} + M_{ms} R + R^T M_{ss} R$$

$$C_R = C_{mm} + R^T C_{sm} + C_{ms} R + R^T C_{ss} R$$

$$K_R = K_{mm} + R^T K_{sm} + K_{ms} R + R^T K_{ss} R \quad (4)$$

and the master-slave degrees of freedom can be written as follows:

$$x_s = -K_{ss}^{-1} K_{sm} x_m \quad (5)$$

Thus, the dynamic condensation matrix R can be expressed as:

$$R = -K_{ss}^{-1} K_{sm} \quad (6)$$

FIG. 5 shows an example discretization 500 that could be applied to a concave rock block in applying FEM, with triangular elements 502 (12 in total) and nodes 504, 506. The open circles of nodes 504 represent corner nodes (6 in total), and the dark circles of nodes 506 represent other nodes (5 in total). In one example, the degrees of freedom associated with corner nodes 504 are assigned as master degrees of freedom, while other degrees of freedom associated with the rest of nodes 506 are assigned as slave degrees of freedom. For a two dimensional analysis (2D), there are two degrees of freedom associated with every point. So for this example, there are 11 total nodes (22 degrees of freedom) and they are assigned to 6 master points (12 degrees of freedom) and 5 slave points (10 degrees of freedom). Applying the condensation as shown in Equation (3)-(6), the original system with 22 degrees of freedom is reduced to a system with only 12 degrees of freedom. By applying this condensation for all the rock blocks in complex fracture network, the total number of degrees of freedom can be significantly reduced.

In the above example, for a three dimensional analysis (3D), the Equation (1) can include three displacement components on each corner of the rock block. The displacements can include, for example, an x-coordinate, a y-coordinate and a z-coordinate in an xyz-coordinate system. The unknown included in x, $\dot{x}$, and $\ddot{x}$ can be solved, for example, by some solvers such as an ordinary differential equations (ODEs) solver, a differential algebraic equations (DAEs) solver, or any other appropriate system or algorithm. In some implementations, the above system of equations can be solved at each time step for each rock block, which can provide time-evolution solution of displacement and strains for all discrete rock blocks. In some instances, normal and shear failure of the rock blocks can be modeled by time-evolution of the block models, for example, by monitoring the time-dependent displacements and strains of the rock blocks and identifying the variations of the displacements and strains with respect to time.

By applying the condensation to each rock block, the contact between rock blocks is reduced to point-to-point contact-type. The CZM fracture model can be applied to these point-to-point contacts to provide a correlation between fraction forces and fracture openings, and it can incorporate meaningful physical parameters. There are different variations of CZM. An example general governing equation for CZM can be represented as shown in Equation (2), $$F = F(\delta_n, \delta_t, \sigma_{max}, \tau_{max} \ldots) \quad (7),$$

where F includes the variables and can represent the traction forces. This general equation can be modified or adapted for a particular variation of CZM. In the above example, the traction forces F are functions of normal separations of fracture $\delta_n$, shear separation of the fracture $\delta_t$, maximum tensile strength $\sigma_{max}$, maximum cohesive strength $\tau_{max}$, and any other appropriate parameters. In some implementations, the normal separation $\delta_n$, can influence shear failure, and vice versa. In some implementations, the traction forces F can represent the equivalent nodal forces acting at the predefined joint model locations. The CZM model may calculate the equivalent forces at predefined joint model locations. Using the example shown in FIG. 5 where contacts between the two adjacent rock blocks 402 and 404 are simplified to two nodal contacts 410 and 412, the forces F in this case can include four elements, for instance, one normal and one shear components for each nodal contact. As a result, Equation (7) can be rewritten as four equations and each equation can represent the equivalent normal or shear force component acting at one of the nodal contacts. In some instances, the equivalent forces acting at the predefined nodal contact locations can represent all inter-block forces between the two rock blocks.

In some implementations, a procedure for solving the system of equations of the CZM model can be performed at each time step for each joint in a considered fracture network. The time-dependent calculation can further support to the simulation system track fracture initiation and propagation in the fracture network. In some instances, the predefined joint model locations may not depend on the time step, or the joint model locations can change over simulated time. As such, searching for and tracking the physical contact locations between the two rock blocks at every time step can be avoided in some instances, and the computational load associated with the search and tracking can be reduced or eliminated. Different modifications can be made to Equation (7) for the CZM model, and additional or different components can be included in the variable or the parameters. In some instances, properties (e.g., numbers, locations, etc.) of the predefined joint model locations for the joint models can be set as default values, adjusted according to system requirements or simulations progress, or configured based on any other settings as appropriate. Alternatively or additionally, other formulations can be used for modeling the joint between adjacent discrete rock blocks.

The interactions between FEM model and CZM can be represented, for example, by the links 304a and 304b in FIG. 3. In some implementations, the links 304a and 304b can map the variables or parameters of one of the models into the parameters of the other model based on some predefined relationships. As a specific example, the block models 302a and 302b can be the FEM models, and the joint model 303 can be the CZM fracture model. With parameters such as the mass matrix M, damping matrix C, and stiffness matrix K and an initial boundary condition (e.g., initial forces vector F applied to the rock blocks), solving the governing equations (e.g., Equation (1)) of the FEM models can obtain the displacements and strain of the rock blocks. Based on the displacements and strain information, fracture separations (both in normal and shear direction, e.g., $\delta_n$, and $\delta_t$) can be derived and then served as input parameters to the fracture CZM model. The governing equations (e.g., Equation (7)) of the fracture CZM model can then be solved for the traction forces F. The traction forces F can in return serve as force boundary conditions of the discrete rock block FEM type models.

In some cases, the block model (e.g., FEM model) for each rock block can represent intra-block mechanics of the rock block in response to inter-block forces (e.g., F) determined by the joint models. The joint model (e.g., CZM) for each adjacent pair of rock blocks can represent inter-block mechanics between adjacent rock blocks in response to rock block movement (e.g., displacements and strain of the rock blocks) determined by the block models. In this way, these two types of models can be tightly coupled in the simulation system. Governing equations of each discrete rock block can be solved and equilibrium of the whole fracture network can be obtained at every time step.

The simulation techniques described here can be implemented in an injection treatment simulation system that uses tightly coupled subsystem models. Some example technique for simulating an injection treatment using tightly coupled models include defining subsystem models for each physical subsystem of the injection treatment system, and creating separate structures (e.g., couples) that represent relationships between the variables of each model and the parameters of other models. The simulation can proceed, for example, by defining a common solution vector from the subsystem models; updating the parameters of all subsystem models based on the common solution vector according to the predefined relationships (e.g., the couples); calculating residual values of the subsystem models based on the common solution vector and the updated parameters; and refining the common solution vector based on the residual values.

In some implementations, for the rock model and the discrete rock block deformation and stresses analysis, different constitutive laws can be applied for different rock materials, such as linear elasticity, elastic-plasticity, creep, etc. For the joint model, alternatively or additionally, some other models, methods, or techniques can be used to describe fracture behavior, such as linear spring, discontinuous models, etc. In using the predefined joint model locations (e.g., nodal contacts) to couple the joint models and block models, other types of fracture models can be implemented to replace or complement CZM and work with the block models to simulate fracture initiation and propagation in a subterranean zone for various circumstances.

In some implementations, additional or different subsystem models (for example, a fluid junction model, a fracture flow model, a leak off model, a wellbore model, etc.) can be incorporated to perform injection treatment simulations. As a specific example, fracturing fluid models can be coupled with the block models and the joint models to simulate hydraulic fracturing process in the fracture network. The initial or existing fractures can provide fluid channels for fracturing fluid, and when fracturing fluid is injected into these fractures in the subterranean zone, fluid pressure can be applied on rock blocks. Because of fluid pressure, new fractures may be opened and then fractures can propagate. The interactions between the fracturing fluid models and block models, as well as the fracturing fluid models and the fracture models can be established based on, for example, one or more of the fluid pressure, displacements of the rock blocks, separations and orientations of the fractures, etc. The combined block models, joint models, and the fracturing fluid models can help simulate fluid flow about the rock blocks during an injection treatment applied to the subterranean zone.

Some embodiments of subject matter and operations described in this specification can be implemented in digital electronic circuitry, or in computer software, firmware, or hardware, including the structures disclosed in this specification and their structural equivalents, or in combinations of one or more of them. Some embodiments of subject matter described in this specification can be implemented as one or more computer programs, i.e., one or more modules of computer program instructions, encoded on computer storage medium for execution by, or to control the operation of, data processing apparatus. A computer storage medium can be, or can be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially generated propagated signal. The computer storage medium can also be, or be included in, one or more separate physical components or media (e.g., multiple CDs, disks, or other storage devices).

The term "data processing apparatus" encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

Some of the processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and processors of any kind of digital computer. Generally, a processor will receive instructions and data from a read only memory or a random access memory or both. A computer includes a processor for performing actions in accordance with instructions and one or more memory devices for storing instructions and data. A computer may also include, or be operatively coupled to receive data from or transfer data to, or both, one or more mass storage devices for storing data, e.g., magnetic, magneto optical disks, or optical disks. However, a computer need not have such devices. Devices suitable for storing computer program instructions and data include all forms of non-volatile memory, media and memory devices, including by way of example semiconductor memory devices (e.g., EPROM, EEPROM, flash memory devices, and others), magnetic disks (e.g., internal hard disks, removable disks, and others), magneto optical disks, and CD ROM and DVD-ROM disks. The processor and the memory can be supplemented by, or incorporated in, special purpose logic circuitry.

To provide for interaction with a user, operations can be implemented on a computer having a display device (e.g., a monitor, or another type of display device) for displaying information to the user and a keyboard and a pointing device (e.g., a mouse, a trackball, a tablet, a touch sensitive screen, or another type of pointing device) by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

A client and server are generally remote from each other and typically interact through a communication network. Examples of communication networks include a local area network ("LAN") and a wide area network ("WAN"), an inter-network (e.g., the Internet), a network including a satellite link, and peer-to-peer networks (e.g., ad hoc peer-to-peer networks). The relationship of client and server arises by virtue of computer programs running on the respective computers and having a client-server relationship to each other.

While this specification contains many details, these should not be construed as limitations on the scope of what may be claimed, but rather as descriptions of features specific to particular examples. Certain features that are described in this specification in the context of separate implementations can also be combined. Conversely, various features that are described in the context of a single implementation can also be implemented in multiple embodiments separately or in any suitable sub combination.

Accordingly, certain aspects encompass a computer-implemented method of simulating an injection treatment. The method includes modeling physically separate rock blocks of a subterranean zone by separate block models. The block model for each physically separate rock block represents intra-block mechanics of the rock block by finite element method. Condensation is performed in the finite element method to reduce nodal degrees of freedom operated on by the finite element method. Interactions between adjacent pairs of the rock blocks are modeled by separate joint models. The joint model for each adjacent pair of rock blocks represents inter-block mechanics between the adjacent rock blocks. An injection treatment of the subterranean zone is simulated, by data processing apparatus, with the block models and the joint models.

Certain aspects encompass a non-transitory computer-readable medium storing instructions that, when executed by data processing apparatus, perform operations. The operations include modeling physically separate rock blocks of a subterranean zone by separate block models. The block model for each physically separate rock block represents intra-block mechanics of the rock block by finite element method. Condensation is performed in the finite element method to reduce nodal degrees of freedom operated on by the finite element method. Interactions between adjacent pairs of the rock blocks are modeled by separate joint models. The joint model for each adjacent pair of rock blocks represents inter-block mechanics between the adjacent rock blocks. An injection treatment of the subterranean zone is simulated, by data processing apparatus, with the block models and the joint models.

Certain aspects encompass an injection treatment simulation system including one or more computers configured to perform operations. The operations include modeling physically separate rock blocks of a subterranean zone by separate block models. The block model for each physically separate rock block represents intra-block mechanics of the rock block by finite element method. Condensation is performed in the finite element method to reduce nodal degrees of freedom operated on by the finite element method. Interactions between adjacent pairs of the rock blocks are modeled by separate joint models. The joint model for each adjacent pair of rock blocks represents inter-block mechanics between the adjacent rock blocks. An injection treatment of the subterranean zone is simulated, by data processing apparatus, with the block models and the joint models.

The aspects above encompass some, none or all of the following features. Performing condensation in the finite element method can include performing the finite element method using only a subset of the degrees of freedom of the finite element mesh. Performing condensation in the finite element method can include performing Guyan condensation. Performing condensation in the finite element method can include performing condensation on a plurality of the block models in parallel processes. In certain instances, the joint model for each adjacent pair of rock blocks represents inter-block mechanics between the adjacent rock blocks as predefined inter-block joints. In certain instances, one or more of the adjacent pairs of rock blocks contact each other at physical contact locations, and the joint model for each adjacent pair of rock blocks represents inter-block forces between the rock blocks at predefined joint model locations that are different from the physical contact locations. In certain instances, the joint model for each adjacent pair of rock blocks represents all inter-block forces between the rock blocks as equivalent forces acting at two predefined joint model locations. Simulating an injection treatment can include simulating time-evolution of the rock blocks and their interactions during an injection treatment applied to the subterranean zone. Simulating an injection treatment can include simulating fluid flow in and about the rock blocks during an injection treatment applied to the subterranean zone. In certain instances, the block model for each rock block represents intra-block mechanics of the rock block in response to inter-block forces determined by the joint models. In certain instances, the joint model for each adjacent pair of rock blocks represents inter-block mechanics between adjacent rock blocks in response to rock block movement determined by the block models.

A number of embodiments have been described. Nevertheless, it will be understood that various modifications can be made. Accordingly, other embodiments are within the scope of the following claims.

What is claimed is:

1. A computer-implemented method of simulating an injection treatment, the method comprising:
    modeling physically separate rock blocks of a subterranean zone by separate block models, the block model for each physically separate rock block representing intra-block mechanics of the rock block by a finite element method and comprising performing condensation in the finite element method to reduce nodal degrees of freedom operated on by the finite element method;
    modeling interactions between adjacent pairs of the rock blocks by separate joint models, the joint model for each adjacent pair of rock blocks representing inter-block mechanics between the adjacent rock blocks; and
    simulating, by a data processing apparatus, an injection treatment of the subterranean zone with the block models and the joint models.

2. The method of claim 1, wherein performing condensation in the finite element method comprises performing the finite element method using only a subset of the degrees of freedom of the finite element mesh.

3. The method of claim 1, wherein performing condensation in the finite element method comprises performing Guyan condensation.

4. The method of claim 1, wherein performing condensation in the finite element method comprises performing condensation on a plurality of the block models in parallel.

5. The method of claim 1, wherein the joint model for each adjacent pair of rock blocks represents inter-block mechanics between the adjacent rock blocks as predefined inter-block joints.

6. The method of claim 1, wherein one or more of the adjacent pairs of rock blocks contact each other at physical contact locations, and the joint model for each adjacent pair of rock blocks represents inter-block forces between the rock blocks at predefined joint model locations that are different from the physical contact locations.

7. The method of claim 1, wherein the joint model for each adjacent pair of rock blocks represents all inter-block forces between the rock blocks as equivalent forces acting at two predefined joint model locations.

8. The method of claim 1, wherein simulating an injection treatment includes simulating time-evolution of the rock blocks and their interactions during an injection treatment applied to the subterranean zone.

9. The method of claim 1, wherein simulating an injection treatment includes simulating fluid flow in and about the rock blocks during an injection treatment applied to the subterranean zone.

10. The method of claim 1, wherein the block model for each rock block represents intra-block mechanics of the rock block in response to inter-block forces determined by the joint models.

11. The method of claim 1, wherein the joint model for each adjacent pair of rock blocks represents inter-block mechanics between adjacent rock blocks in response to rock block movement determined by the block models.

12. A non-transitory computer-readable medium storing instructions that, when executed by a data processing apparatus, perform operations comprising:
    modeling physically separate rock blocks of a subterranean zone by separate block models, the block model for each physically separate rock block representing intra-block mechanics of the rock block by a finite element method and comprising performing condensation in the finite element method to reduce nodal degrees of freedom operated on by the finite element method;
    modeling interactions between adjacent pairs of the rock blocks by separate joint models, the joint model for each adjacent pair of rock blocks representing inter-block mechanics between the adjacent rock blocks; and
    simulating an injection treatment of the subterranean zone with the block models and the joint models.

13. The computer-readable medium of claim 12, wherein performing condensation in the finite element method comprises using only a subset of the degrees of freedom of the finite element mesh.

14. The computer-readable medium of claim 12, wherein performing condensation in the finite element method comprises performing Guyan condensation.

15. The computer-readable medium of claim 12, wherein performing condensation in the finite element method comprises performing condensation on a plurality of the block models in parallel.

16. The computer-readable medium of claim 12, wherein one or more of the adjacent pairs of rock blocks contact each other at physical contact locations, and the joint model for each adjacent pair of rock blocks represents inter-block forces between the rock blocks at predefined joint model locations that are different from the physical contact locations.

17. The computer-readable medium of claim 12, wherein simulating an injection treatment includes simulating fluid flow in and about the rock blocks during an injection treatment applied to the subterranean zone.

18. An injection treatment simulation system comprising one or more computers configured to perform operations comprising:
    modeling physically separate rock blocks of a subterranean zone by separate block models, the block model for each physically separate rock block representing intra-block mechanics of the rock block by a finite element method and comprising performing condensation in the finite element method to reduce nodal degrees of freedom operated on by the finite element method;
    modeling interactions between adjacent pairs of the rock blocks by separate joint models, the joint model for each adjacent pair of rock blocks representing inter-block mechanics between the adjacent rock blocks; and
    simulating an injection treatment of the subterranean zone with the block models and the joint models.

19. The injection treatment system of claim 18, wherein performing condensation in the finite element method comprises performing the finite element method using only a subset of the degrees of freedom of the finite element mesh.

20. The injection treatment system of claim 18, wherein performing condensation in the finite element method comprises performing Guyan condensation.

21. The injection treatment system of claim 18, wherein performing condensation in the finite element method comprises performing condensation on a plurality of the block models in parallel.

22. The injection treatment simulation system of claim 18, wherein the joint model for each adjacent pair of rock blocks represents inter-block mechanics between the adjacent rock blocks as predefined inter-block joints.

23. The injection treatment simulation system of claim 18, wherein one or more of the adjacent pairs of rock blocks contact each other at physical contact locations, and the joint model for each adjacent pair of rock blocks represents inter-block forces between the rock blocks at predefined joint model locations that are different from the physical contact locations.

24. The injection treatment simulation system of claim 18, wherein the block model for each rock block represents intra-block mechanics of the rock block in response to inter-block forces determined by the joint models.

25. The injection treatment simulation system of claim 18, wherein the joint model for each adjacent pair of rock blocks represents inter-block mechanics between adjacent rock blocks in response to rock block movement determined by the block models.

* * * * *